Figure 1:
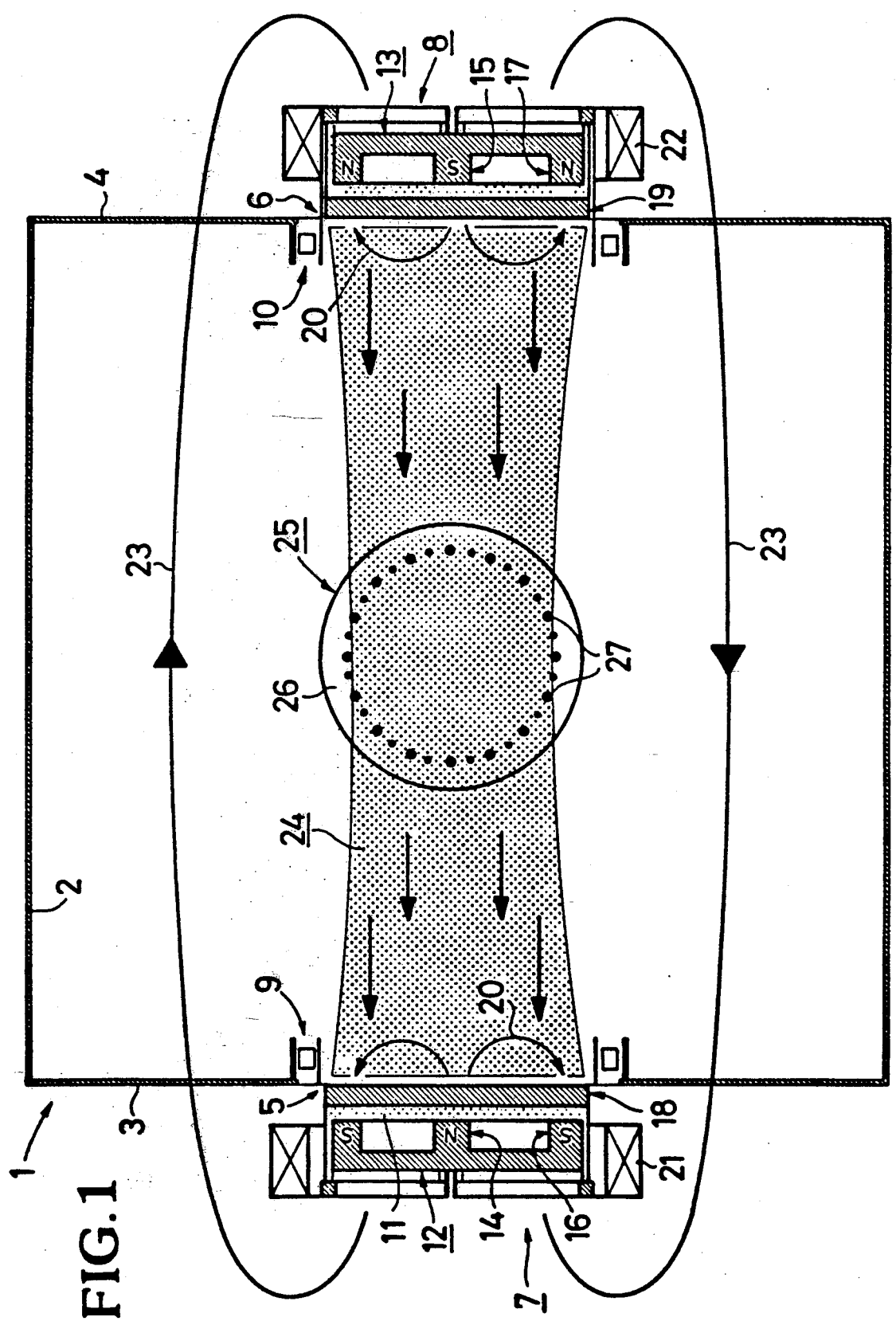

United States Patent [19]
Feuerstein et al.

[11] Patent Number: 5,196,105
[45] Date of Patent: Mar. 23, 1993

[54] SYSTEM FOR COATING SUBSTRATES WITH MAGNETRON CATHODES

[75] Inventors: Albert Feuerstein, Neuberg; Dieter Hofmann, Bruchköbel; Hans Schussler, Schiffweiler, all of Fed. Rep. of Germany

[73] Assignee: Leybold Aktiengesellschaft, Hanau am Main, Fed. Rep. of Germany

[21] Appl. No.: 665,624

[22] Filed: Mar. 6, 1991

[30] Foreign Application Priority Data

Dec. 3, 1990 [DE] Fed. Rep. of Germany ....... 4038497

[51] Int. Cl.$^5$ ................................................ C23C 14/34
[52] U.S. Cl. ........................... 204/298.19; 204/192.12; 204/298.17; 204/298.26
[58] Field of Search ................ 204/192.12, 298.16, 204/298.17, 298.18, 298.19, 298.26

[56] References Cited

U.S. PATENT DOCUMENTS

| | | | |
|---|---|---|---|
| 4,576,700 | 3/1986 | Kadokura et al. | 204/298.24 X |
| 4,871,434 | 10/1989 | Munz | 204/192.16 |
| 4,880,515 | 11/1989 | Yoshikawa et al. | 204/298.19 X |
| 4,931,158 | 6/1990 | Bunshah et al. | 204/192.29 |
| 5,000,834 | 3/1991 | Yoshikawa | 204/298.17 X |
| 5,022,978 | 6/1991 | Hensel et al. | 204/298.19 |

FOREIGN PATENT DOCUMENTS 0144838 6/1985 European Pat. Off. .
63-103067 5/1988 Japan .
1-294859 11/1989 Japan .

OTHER PUBLICATIONS

Yeom et al, J. Vac. Sci. & Technol. A 6 Nov./Dec. 1988.
Munz, J. Vac. Sci. & Technol. A 4 (6), Nov. Dec. (1986).

Primary Examiner—Nam X. Nguyen
Attorney, Agent, or Firm—Felfe & Lynch

[57] ABSTRACT

The present invention provides a system for coating substrates which are arranged within a vacuum chamber on a substrate holder which is situated at least partially in a coating range on whose both sides magnetron cathodes with magnet systems of permanent magnets with outside poles and inside poles are disposed, wherein the polarity of the magnet systems of the magnetron cathodes is such that poles of opposed polarity are opposite one another on both sides of the coating range; and on opposite sides of the coating range at least one magnet coil is disposed, and the oppositely situated magnet coils being connectable to a power source in such a manner that the fields of the magnet coils together make up a closed magnetic field, and that the polarity of the outside poles of the permanent magnet systems and of the magnet coils is the same.

8 Claims, 5 Drawing Sheets

SYSTEM FOR COATING SUBSTRATES WITH MAGNETRON CATHODES

The invention relates to a system for coating substrates which are arranged on a substrate holder within a vacuum chamber, the system being situated at least in part in a coating range on whose both sides magnetron cathodes are disposed having magnet systems of permanent magnets with outside poles and inside poles, and whose targets are aligned with the coating range.

German Patent 31 07 914 discloses such a system in which the magnetron cathodes are arranged, even as regards polarity, in mirror-image symmetry about a path of movement of the substrates, which are carried through the gap between the targets. The mirror-image arrangement also is true of the configuration and pole position of the magnet systems. With such a system it is possible, with an appropriately weak design of the magnet systems and a correspondingly high negative bias voltage on the substrates and on the substrate holder, to expand the plasma so that it flows around all sides of the substrates. The magnet systems of magnetron cathodes commonly serve to hold the plasma to a great extent close to the target surface in order thereby to increase the sputtering rates in comparison to so-called diode arrangements, by a factor of 10 to 30, and at the same time to reduce the flow of energy to the substrates. The weakening of the magnet systems and the use of a negative bias voltage therefore cooperate to partially counteract the concentrating effect of the magnetic tunnel, so as to expose the substrates directly to the plasma.

The above-described artifice, however, works only as long as the substrates do not have excessively great dimensions, or, as long as a substrate holder on which a plurality of substrates are held does not have excessively great dimensions. That is, the said dimensions determine the minimum distance of the targets from one another.

Numerous works have been published in the past on electromagnetically detuned magnetron cathodes, which are also referred to as "unbalanced magnetrons." By an appropriate superposition of the fields of permanent magnets and electromagnets it is brought about that the magnetic lines of force extend very much further into the space in front of the sputtering surface of the target, so that the plasma-filled space also expands accordingly. This spatial expansion of the plasma is then used for the purpose of making the plasma cover substrates, or substrate arrangements or groups, of correspondingly great dimensions. The plasma, however, even in this case operates only unilaterally, i.e., from the one magnetron cathode to the substrates.

The invention is therefore addressed to the problem of devising a system of the kind described above, with which a coating range of great volume can be produced, through which a plurality of substrates can be transported, or in which a plurality of substrates can remain simultaneously. Instead of the plurality of substrates, a substrate of correspondingly great size can, of course, be held in the coating range. Simply expressed, the free distance between the targets is to be considerably increased without causing the magnetic field strength to drop below the critical limit for inclusion in the plasma.

The solution of the stated problem is achieved in accordance with the invention, in the system referred to above, a) by selecting the polarity of the magnet systems of the magnetron cathodes such that poles of opposed polarity are opposite one another on both sides of the coating range,
b) by disposing at least one magnet coil on each of the opposite sides of the coating range, the opposite magnet coils being associated each with one magnetron cathode and being connectable to a power supply such that the fields of the magnet coils together make up a closed magnetic field in which the coating range is situated, and
c) by making the polarity of the outside poles of the permanent magnet system and magnet coils identical.

By the measures taken in accordance with the invention it is brought about that a kind of "uninterrupted magnetic tube" extends from one magnetron cathode to the other, opposite magnetron cathode and at the same time encloses the coating range. In this magnetic tube is a plasma of high intensity which is characterized by a high concentration of electrons which perform helical movements about the magnetic lines of force. In this manner the probability of ionization is quite considerably increased.

The polarity of the magnetic coils with respect to one another is important, but especially in connection with the polarity of the magnet systems of the magnetron cathodes. This polarity is not in mirror-image symmetry with respect to a plane of symmetry situated between the targets; that is, poles of different polarity lie on both sides of this virtual plane of symmetry.

It is also an important point that the magnetron cathodes have magnet systems like those commonly used in such magnetron cathodes, i.e., an inner pole, which can be in the shape of a circle or of an elongated strip, associated with an outer pole having a closed circuit in the form of a circle, a rectangle or an oval (racetrack), so that a continuous magnetic tunnel can form between the outer pole and the inner pole.

Details of these measures and their effects will be further explained in the detailed description.

It is especially advantageous if at least on both sides of a virtual envelope extending between the margins of the oppositely situated targets and surrounding the coating range at least one electrode is disposed which is insulated from the vacuum chamber and to which a voltage positive with respect to ground can be applied, preferably a voltage between +10 and +220 volts.

It is furthermore advantageous in that case if on the outside, facing away from the coating range, of the above described at least one electrode, at least one additional magnet system having outside and inside poles is disposed, which forms at least one closed magnetic tunnel on the inside of the electrode facing the coating range, and if the polarity of the outside pole of the magnet system of the electrodes is made opposite to the polarity of the outside pole of the magnetic systems of the adjacent magnetron cathodes in each case.

In this manner an expansion of the "magnetic tube" is performed— by superposition of magnetic fields—toward the above-mentioned at least one electrode. This in turn leads to an enlargement of the plasma-filled volume, so that correspondingly larger substrates or groups of substrates can be contained in the plasma.

At the same time it is furthermore advantageous if, when magnetron cathodes of rectangular target outline are used, and if two additional electrodes situated opposite one another and having a likewise rectangular outline are used, the longitudinal edges of the magnetron cathodes and of the additional electrodes are of approximately the same length and arranged parallel to one another.

Additional advantageous configurations of the subject matter of the invention will be found in the rest of the subordinate claims and in the detailed description.

Embodiments of the subject matter of the invention will be further explained below in conjunction with FIGS. 1 to 5.

Figure 2:
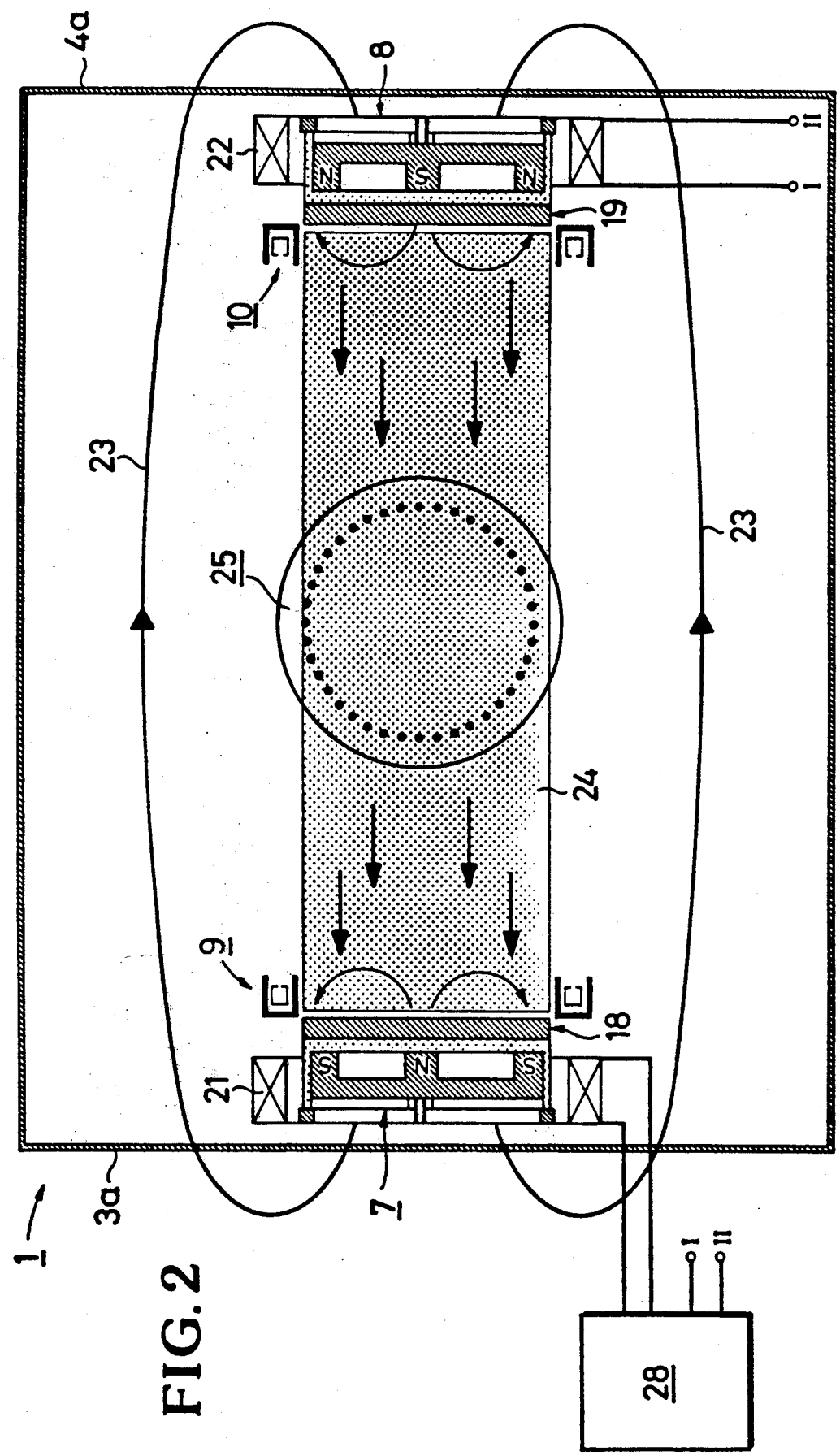
Figure 3:
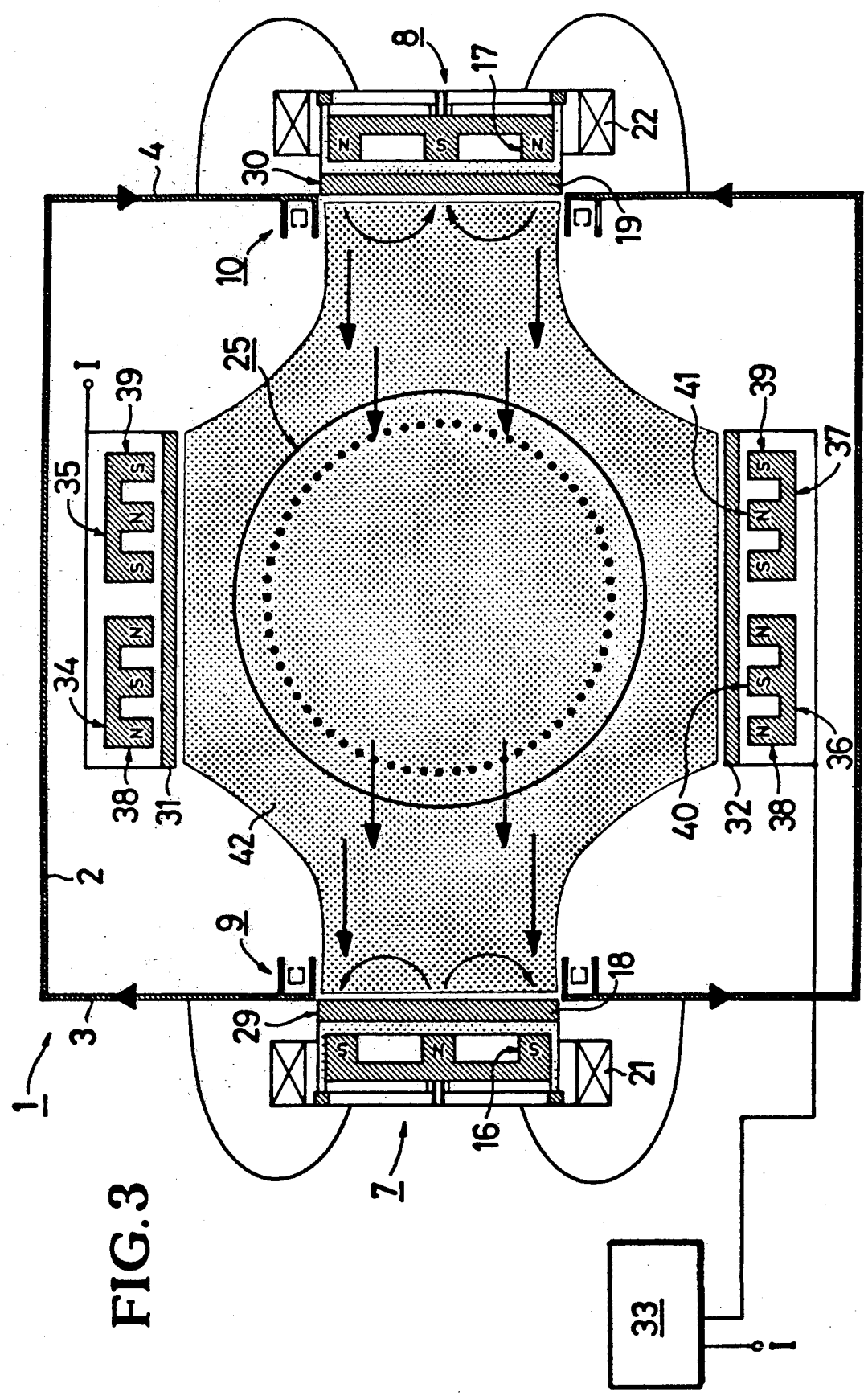
Figure 4:
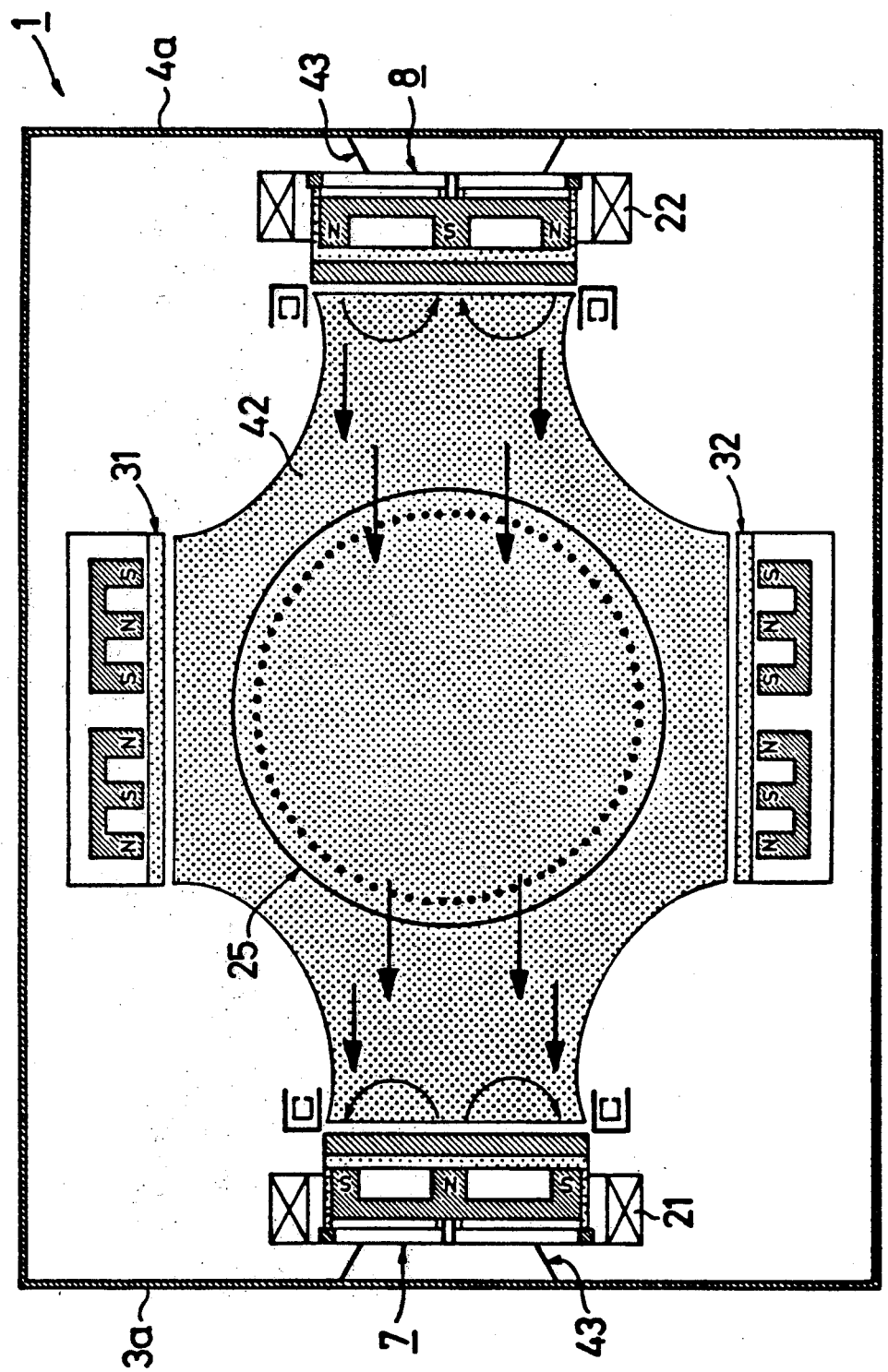
Figure 5:
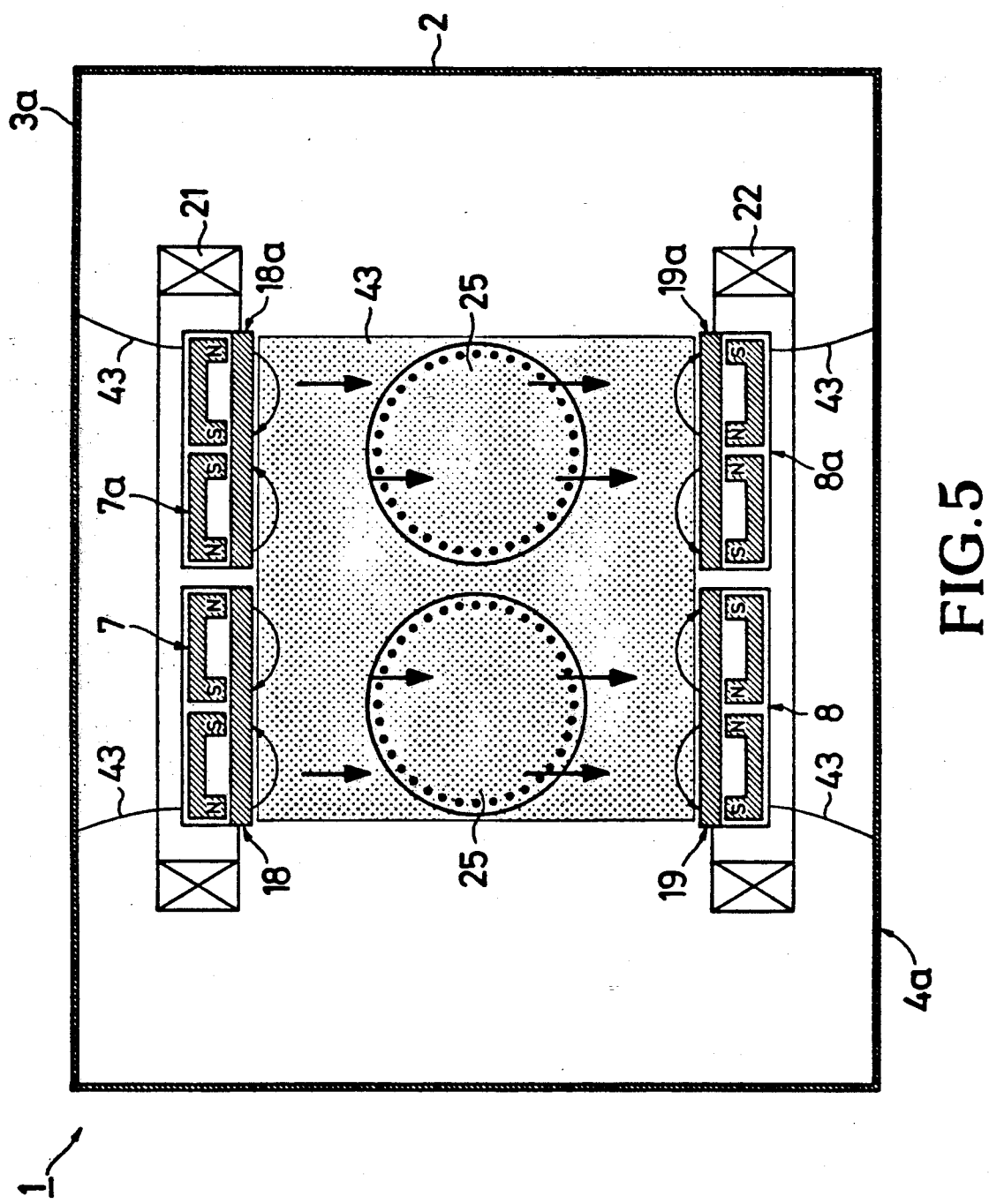

The diagrammatic drawings show the following:

FIG. 1 an axial section through an arrangement of two oppositely situated magnetron cathodes which are inserted into the parallel ends of a vacuum chamber and in which the magnet coils are on the outside, FIG. 2 an arrangement similar to FIG. 1, in which, however, the magnetron cathodes and magnet coils are on the interior of the vacuum chamber, FIG. 3 an arrangement of two magnetron cathodes with magnet coils as in FIG. 1, but with two additional electrodes behind which additional magnet systems are disposed, FIG. 4 an arrangement similar to FIG. 3, but with the difference that the magnetron cathodes and their associated magnet coils are arranged inside of the vacuum chamber, and FIG. 5 an arrangement similar to FIG. 2, in which, however, two magnetron cathodes in close proximity to one another are disposed inside of each magnet coil.

In FIG. 1 is shown a vacuum chamber 1 which can have any desired shape. Thus, the wall 2 can surround a parallelepipedal or cylindrical chamber, and in the latter case the chamber axis is horizontal. The chamber wall has two walls 3 and 4 parallel to one another at the opposite ends in which there are openings 5 and 6 for the insertion of magnetron cathodes 7 and 8, respectively.

The tubing that runs to the vacuum pumps and gas sources has been omitted for simplicity. There are shown only the gas distributing lines 9 and 10 which surround the openings 5 and 6, respectively, and have a plurality of orifices through which a gas or gas mixture can be introduced into the vacuum chamber 1. The gases can be noble gases such as argon. If reactive processes are to be performed, reactive gases such as oxygen or nitrogen can be fed additionally or solely through the gas distributing lines 9 and 10. If carbides or polymers are to be deposited as coatings, the appropriate hydrocarbons can be fed through the gas distributing lines 9 and 10, mixed, if necessary, with a noble gas. The systems for controlling the gas feed are not shown, nor are the electric power supplies and controls for the magnetron cathodes 7 and 8.

The magnetron cathodes 7 and 8 are of conventional types: in cathode bases 11 in the form of hollow copper pans, a system of magnets 12 and 13 is disposed in back of the pan bottoms. Each of these magnet systems consists of inside poles 14 and 15 and outside poles 16 and 17. The inside poles 14 and 15 can have circular pole faces. The outside poles consist, as a rule, of an endless or continuous row of individual magnets whose like pole faces can lie on a circular surface. In the present case the magnetron cathodes are rotationally symmetrical cathodes. However, it is also possible, and especially advantageous, for the inside poles to be elongated (with a narrow rectangular pole face) and the outer poles to be arranged on the periphery of a rectangle or oval, so that so-called "rectangular cathodes" are formed.

On the side of the bottom of each cathode base 11 facing away from the magnet systems there are plate-like targets 18 and 19 whose outline matches the shape of the outside poles 16 and 17, respectively. By the effect of the magnet systems 12 and 13, an endless magnetic tunnel is formed on the outer surfaces of the targets 18 and 19, which are the so-called sputtering surfaces; this magnetic tunnel is indicated by the arcuate magnetic field lines 20. These field lines define a so-called "near field," and normally the formation of an intense plasma discharge would be limited to the volume enclosed by the field lines 20.

Between the magnetron cathodes 7 and 8 there is the so-called "coating range" which will be further discussed below. In the case of the system represented, however, there is one feature different from the state of the art: the polarity of the magnet systems 12 and 13 is selected such that poles of opposite polarity are opposite one another on opposite sides of the coating range. For example, the outside pole 16 of magnet system 12 is imaged onto the target 18 as a south pole, while the outside pole 17 of the magnet system 13 is imaged onto the target 19 as a north pole. The inside poles 14 and 15 are naturally of the opposite polarity.

The magnetron cathodes 7 and 8 and their cathode bases 11 are surrounded on their outer circumference by the magnet coils 21 and 22, respectively, at a relatively short distance therefrom. The power sources of these magnet coils have been omitted for simplicity. The direction of winding and the terminals of the two magnet coils 21 and 22, however, have been selected such that it is not individual, self-contained magnetic fields that form at the two magnet coils, but that the fields of the two magnet coils combine to form a continuous, closed magnetic field including both of the magnet coils. The shape of this magnetic field is symbolized by the lines 23.

By the chosen polarization both of the magnet systems 12 and 13 and of the magnet coils 21 and 22, a kind of "magnetic tube" is created, which practically fills a volume that is situated in a virtual envelope that is formed by generatrices running in straight lines between the opposite margins of the targets. The plasma range thus formed, also called the "coating range," is shown shaded in the figures. In the case of rotationally symmetrical magnetron cathodes, i.e., those with circular disk-shaped targets, this range is approximately of cylindrical shape. In the case of so-called rectangular cathodes, the coating range is of parallelepipedal shape. In rectangular cathodes the longest axis would run perpendicular to the plane of drawing in FIG. 1, and the depth of the coating range 24 would run accordingly.

In the middle of the coating range is a rotatory substrate holder 25 whose driven shaft is likewise perpendicular to the plane of drawing in FIG. 1. Part of this substrate holder is a base plate 26 of circular shape, to which a plurality of holding rods 27 is fastened in an arrangement concentric with the shaft axis; these rods serve to hold individual substrates. Such a substrate holder is also called a "cage." Due to the enlarged spatial configuration of the coating range 24, which is defined by the so-called magnetic "remote field," it is possible in any case either to fit a large single substrate or a plurality of smaller substrates into a considerably enlarged coating zone. In this coating zone the substrates are struck by the plasma from both sides, i.e., from the direction of the two magnetron cathodes 7 and 8. By the rotation of the substrate holder 25 the substrates are exposed successively to the plasma on all sides, and this effect can be still further improved by rotating also the individual holding rods about their own axes, so that the substrates perform movements in the manner of a cycloid or evolvent.

It is also to be noted that, in the present case, the vacuum chamber 1 consists of a nonmagnetic material such as high-grade steel, so that the returning magnetic lines of force corresponding to lines 23 can pass through the end walls 3 and 4. A largely similar arrangement is shown in FIG. 2, except that the vacuum chamber 1 has two solid end walls 3a and 4a, and that the magnetron cathodes 7 and 8 as well as the magnet coils 21 and 22 are disposed inside of the vacuum chamber, but in direct proximity to the end walls 3a and 4a. Also shown is a power source 28 for supplying the magnet coils 21 and 22 with the required energizing current (direct current).

FIG. 3 shows an arrangement similar to FIG. 1, except that, first, the vacuum chamber 1 in this case consists of a ferromagnetic material, so that the return of the magnetic flux runs through the vacuum chamber 1 in accordance with the arrows. As regards the placement of the poles of the magnet systems of the magnetron cathodes 7 and 8 and of the magnet coils 21 and 22, the same applies as in the subject matter of FIGS. 1 and 2. In this case, however, on both sides of a virtual envelope extending between the margins 29 and 30 of the oppositely situated targets 18 and 19 and substantially surrounding a coating range as represented in FIGS. 1 and 2, two plate-like electrodes 31 and 32 are disposed which, like the magnetron cathodes 7 and 8, are mounted so as to be insulated from the vacuum chamber 1. In operation, these electrodes 31 and 32 perform an anode function, i.e., a voltage source 33 can place them at an appropriate positive potential.

As seen from the substrate holder 25, two additional magnet systems 34, 35 and 36, 37, likewise having outside poles 38 and 39 and inside poles 40 and 41, respectively, are situated behind the electrodes 31 and 32, but in the shadow of these electrodes. The polarity of the magnet systems 34 to 37 is absolutely alternating, also as regards the directly adjacent magnet systems 34/35 and 36/37, so that arcuate magnetic lines of force form between all of the poles. But note that only the lines of force of each magnet system form a continuous magnetic tunnel over its corresponding portion of the surface of the electrode 31 and 32.

It is furthermore important to note that the outside poles 38 and 39 of the paired magnetic systems 34/35 and 36/37 have, again, a polarity opposite that of the adjacent outside poles 16 and 17 of the magnet systems 12 and 13 of the adjacent magnetron cathodes 7 and 8, respectively. If one imagines stepping from one to the other of all the magnetic poles on the circumference of their virtually continuous series, one will encounter all of the poles exclusively in the order N-S-N-S-N-S . . . . The result of this is that the plasma is contained on its entire surface between electrodes and field lines. As it appears especially in FIG. 3, a still more greatly enlarged coating range 42 is thereby formed.

In the range of the electrodes 31 and 32 the coating range 42 is thereby expanded in volume toward these electrodes, so that the substrate holder 25 represented in FIG. 3 can have a substantially greater diameter than the substrate holders in FIGS. 1 and 2.

Of course, the electrodes 31 and 32 can also consist of a sputterable material, so that by connecting these electrodes to an appropriately high negative voltage, additional magnetron cathodes are formed, so that in this case the substrate holder 25 is surrounded on its periphery by a total of six magnetron cathodes, which correspondingly increases the throughput of the apparatus. The result is that, on both sides of a virtual envelope extending between the rectangle-forming margins of the opposite targets 18 and 19, four additional magnetron cathodes with targets are formed, which are defined by the magnet systems 34, 35, 36 and 37.

FIG. 4 differs from FIG. 3 essentially in that, in this case again, the magnetron cathodes 7 and 8 ad the magnet coils 21 and 22 are disposed inside of the vacuum chamber 1. In this case, too, the vacuum chamber consists of ferromagnetic material, so that the chamber walls serve to complete the magnetic circuit, as indicated by portions 43 of the magnetic field lines.

In the embodiment according to FIG. 5 there is a design principle of an apparatus in which magnetron cathodes 7/8 and 7a/8a are disposed in pairs opposite one another on each side of the vacuum chamber 1, and on each side of the vacuum chamber, near its walls 3a and 4a, they form a cathode group 7/7a and 8/8a, respectively, in which the distance between the longitudinal edges (perpendicular to the plane of drawing) of directly adjacent targets 18/18a and 19/19a is small in relation to the distances between the longitudinal edges of the same target (likewise perpendicular to the plane of drawing), and a magnet coil 21 and 22 is disposed at the periphery of each cathode group 7/7a and 8/8a, respectively.

With this design principle, again, an especially great coating range 43 is achieved, in which even two substrate holders 25 can be disposed in this case.

With the preferred arrangements according to FIGS. 3 and 4 the following processes can be performed:

Etching

To prevent contamination by the substrates by coating in the etching process, a relatively low potential, which can be between $-100$ and $-300$ volts, is applied to the magnetron cathodes 7 and 8. At the substrate holder a voltage is selected between $-300$ and $-2000$ volts. The etching is performed in pure argon at pressures between $5 \times 10^{-4}$ to $5 \times 10^{-2}$ mbar. In the etching process, depending on the plasma density which is determined by adjustments made to the cathode and anode and to the pressure, current densities between 1 and 4 mA/cm$^2$ are achieved. A uniform and intense etching is permitted because the substrate is surrounded on all sides by the plasma. It has proven to be possible to etch successfully even geometrically complex substrates and large groups of substrates. Also it has been found that heat-sensitive pieces can be etched without overheating.

Coating

By using appropriate metal targets, at a sputtering voltage between $-500$ and $-800$ volts at the magnetron cathodes in a reactive atmosphere, parts, preferably, or substrates can be provided with hard coatings, e.g., TiAl-NxCy, TiN, TiNC, TiC, CrNx, ME:C. This is accomplished at low substrate temperatures and nevertheless uniform ion bombardment of the substrates at a high substrate current density, which is greater than 1 mA/cm$^2$. To protect the cutting edges of cutting tools a low substrate potential is preferably used, which is not stronger negatively than about 150 volts.

This design principle is suitable both for continuous pass-through systems and for batch operation. In the case of continuous pass-through systems it can be imagined that the substrate holders 25 are moved through the space between the magnetron cathodes.

We claim:

1. System for coating substrates which are arranged within a vacuum chamber on a substrate holder which is situated at least partially in a coating range on whose both sides magnetron cathodes with magnetic systems of permanent magnets with outside poles and inside poles are disposed, wherein
   a) the polarity of the magnet systems of the magnetron cathodes is such that poles of opposed polarity are opposite one another on both sides of the coating range,
   b) on opposite sides of the coating range at least one magnet coil is disposed, the oppositely situated magnet coils being connectable to a power source in such a manner that the fields of the magnet coils together make up a closed magnetic field, and that
   c) the polarity of the outside poles of the permanent magnet systems and of the magnet coils is the same.

2. System according to claim 1, wherein at least on both sides of a virtual envelope which extends between margin of oppositely situated targets and which surrounds the coating range at least one electrode is disposed, which is insulated from the vacuum chamber and can be applied to a voltage that is positive with respect to ground.

3. System according to claim 2, wherein, on the outside of the electrode facing away from the coating range at least one additional magnet system with outside and inside poles is disposed, which forms at least one closed magnetic tunnel on the inner side of the electrode facing the coating range, and that the polarity of the outside poles of the magnet systems of the electrodes is opposite to the polarity of the outside poles of the magnet systems of the adjacent magnetron cathodes.

4. System according to claim 2, wherein, when magnetron cathodes are used which have a rectangular target outline, and when two electrodes of rectangular outline lying opposite one another are used, the longitudinal edges are approximately equally long and are arranged parallel to one another.

5. System according to claim 4, wherein, on the outer sides of each of the two oppositely lying electrodes at least one elongated magnet system is disposed for the production of at least one closed magnetic tunnel on each inside surface of the respective electrode.

6. System according to claim 4, wherein, on each side of the vacuum chamber a plurality of magnetron cathodes are arranged in pairs opposite one another, which form on each side of the vacuum chamber a cathode group in which the distances between the longitudinal edges of directly adjacent targets are small in proportion to the distances between the longitudinal edges of the same target, and that in the area of the periphery of each cathode group one magnet coil each is disposed.

7. System according to claim 1, wherein, on both sides of a virtual envelope which extends between the rectangle-forming margins of the oppositely lying targets, two additional magnetron cathodes with targets are disposed.

8. System according to claim 1, wherein, if a vacuum chamber of ferromagnetic material is used, the magnet coils of the chamber walls are brought so close to one another that the chamber walls form a magnetic return circuit.

* * * * *